Feb. 19, 1963 M. H. LEWIN 3,078,376

LOGIC CIRCUITS EMPLOYING NEGATIVE RESISTANCE DIODES

Filed Feb. 24, 1959

INVENTOR.
MORTON H. LEWIN
BY
Milton S. Winters
ATTORNEY

United States Patent Office 3,078,376

Patented Feb. 19, 1963

3,078,376

LOGIC CIRCUITS EMPLOYING NEGATIVE RESISTANCE DIODES

Morton Herbert Lewin, Princeton, N.J., assignor to Radio Corporation of America, a corporation of Delaware Filed Feb. 24, 1959, Ser. No. 795,093
13 Claims. (Cl. 307—88.5)

This invention relates generally to switching circuits and more particularly to switching circuits of a type useful in computers or the like.

Switching circuits which utilize pulse type signals to represent binary information are well known in digital computer systems and in other types of digital information handilng machines. In one type of computer system, switching circuits having two stable states are used wherein a binary "one" is represented by a high amplitude pulse and a binary "zero" by a low amplitude pulse. In many computer circuit applications, it is desirable to provide switching circuits for pulse signals of this type that can be simply and reliably changed from one stable state each time a desired input signal, or combination of input signals, is received. Such circuits are used, for example, as "and" gates, "or" gates, threshold gates, in scaling and counting circuits and so on.

It is an object of the present invention to provide improved switching circuits.

It is another object of the present invention to provide improved switching circuits that can be switched from one stable state to the other stable state in a simple and reliable manner.

Still another object of the present invention is to provide improved switching circuits of a novel type that can be conveniently adapted to provide "and" gates, "or" gates and threshold gates.

Yet another object of the present invention is to provide improved switching systems including novel means for propagating digital information through the system.

The foregoing objects are achieved in accordance with one feature of the present invention in a switching circuit utilizing a negative resistance diode which can exist in one or the other of two stable operating states. Pulse type energizing signals, poled so as to forward bias the diode, are applied thereto. In synchronism with the energizing signals, pulse type information signals are applied to the diode. By selecting the amplitude of the energizing signal, either an "and" gate, an "or" gate, or a threshold gate is obtained.

In accordance with another feature of the invention, a prescribed direction of information signal flow is achieved in a cascaded series of stages utilizing negative resistance diodes. Pulse type energizing signals are applied to the negative resistance diodes, and the energizing signals are adjusted so that the state of one stage is switched just before the signal response of the next stage begins, whereby the output signal of each stage is effective as an input signal to control the output of a succeeding stage in the cascaded series, but ineffective to control the output of any preceding stage.

Figure 1:
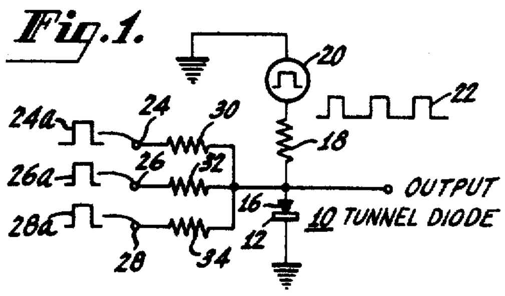
FIGURES 1 and 3 are schematic circuit diagrams of switching circuits utilizing a negative resistance diode in accordance with the present invention.

It is known that a device having a characteristic in which a negative resistance portion is interposed between two positive resistance portions may be used with a suitable load device to form a bistable circuit. FIGURE 1 illustrates one type of bistable circuit which utilizes a negative resistance diode of the voltage controlled type to provide various logical gating functions in accordance with the present invention. A suitable diode for this purpose is a negative resistance diode known as a "tunnel" diode. Diodes of this type are more fully described in the copending application of H. S. Sommers, Jr., Serial No. 789,286, filed January 27, 1959, for "Semiconductor Devices and Methods of Preparation Thereof," and assigned to the same assignee as that of the present invention. The circuit comprises a tunnel diode 10 having a cathode electrode 12 and an anode electrode 16, with the anode electrode 16 connected through a load resistor 18 to one terminal of an energizing pulse generator 20. The cathode 12 is connected to circuit ground. The pulse generator 20 is arranged to provide a train of positive voltage pulses, such as are illustrated at 22, to the anode 16 of the tunnel diode, thereby forward biasing the diode in the presence of a pulse. Three input terminals 24, 26 and 28, to which information signals are applied, are shown for illustrative purposes, and are connected respectively through isolating resistors 30, 32 and 34 to the anode 16 of the tunnel diode 10. Pulse type information signals such as shown at *24a*, *26a* and *28a* are applied to the input terminals.

Figure 2:
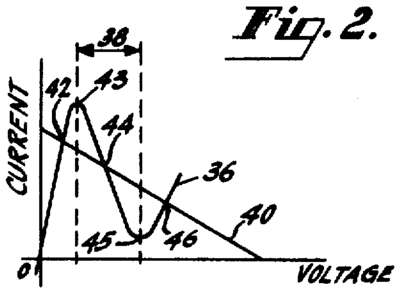
FIGURES 2 and 4 are graphs showing the negative resistance characteristics of the diodes in the circuits of FIGURES 1 and 3, respectively, and are useful in explaining the operation of these circuits.

FIGURE 2 shows the operating characteristics of the circuit of FIGURE 1. A curve 36 illustrates the volt-ampere characteristic of the forward biased tunnel diode and indicates between a pair of dotted lines thereon a region 38 of negative resistance. A point 43 defines the peak of the positive resistance portion. The characteristic curve 36 is simply obtained by plotting the voltage across the tunnel diode 10 as a function of the current through it.

A load line 40 whose slope is determined by the size of the load resistor 18 is drawn on the graph of FIGURE 2 and intersects the curve 36. By properly selecting the load resistor 18, the load line is made to intersect the curve 36 in three points, namely 42, 44 and 46. The points 42 and 46 intersect the curve 36 in positive resistance regions and therefore are points of stable operation. That is, the circuit of FIGURE 1 can be maintained quiescently in either of these two operating points. The intersection 44 of the load line 40 and characteristic 36 is in the negative resistance region and defines an unstable diode operating point. The circuit cannot be maintained quiescently at this operating point with a load line like 40. The circuit is therefore bistable, that is, has two stable operating states. When the circuit is in the state represented by the operating point 42, the voltage across the diode is relatively low, and the diode is said to be in its "low voltage state." This condition can be said to correspond to a binary digit of one type such as binary zero. When the circuit is in the state represented by the operating point 46, the voltage across the diode is relatively high, and the diode is said to be in its "high voltage state." This condition corresponds to a binary digit of the other type—binary one.

The circuit of FIGURE 1 may be simply and conveniently arranged, in accordance with the invention, to provide various types of logic gating functions. To illustrate, assume that an energizing pulse 22 is applied to the anode 16 of the tunnel diode, and at this time the circuit assumes the "zero" state represented by the operating point 42. In synchronism with the application of the energizing pulse 22, one or more of the information signals 24a, 26a, or 28a are also applied to the input terminals. These signals may be conveniently generated by another tunnel diode circuit connected as a driver stage, for example. If sufficient current is supplied to the tunnel diode 10 by the information signals 24a, 26a or 28a to raise the operating point 42 to the peak 43 of the negative resistance characteristic, the tunnel diode then switches to the operating point 46.

Whether a single information signal or a plurality of information signals are required to bring about this change of state is determined by the amplitude of the energizing pulses 22. That is, the amplitude of the energizing pulse 22 determines the position of the load line 40 on the negative resistance characteristic, while the slope of the load line is a constant, determined by the size of the load resistor 18. Thus, if the amplitude of the energizing pulse 22 is made sufficiently large, the load line 40 is shifted sufficiently close to the peak 43 of the negative resistance characteristic so that a single information signal, such as that illustrated at 24a, applied to the input terminal 24 causes the tunnel diode to switch to an opposite stable state. Similarly, if the amplitude of the energizing pulse 22 is made sufficiently small, a plurality of information signals must be applied to the input to supply the needed current to the tunnel diode to bring it to the peak 43 of the negative resistance characteristic thus causing it to switch state. Therefore, by controlling the amplitude of the energizing pulse 22, the circuit may be made to respond to a single information pulse, or any desired number of information pulses.

In accordance with this one feature of this invention, therefore, the circuit may be operated as an "and" gate, an "or" gate, or a threshold gate, simply by adjusting the amplitude of energizing pulse 22. For example, assume it is desired to provide an "and" gate. An "and" gate is a circuit which has two or more inputs, to each of which is applied a pulse of common polarity. The circuit has a single output at which a pulse appears if, and only if, a pulse is applied simultaneously to all inputs. Therefore, an "and" gate may be provided by the circuit of FIGURE 1 by adjusting the amplitude of the energizing signal 22 to a level such that a plurality of information signals must be applied to the circuit to bring the tunnel diode over the peak 43 of the negative resistance curve thereby switching it to its other stable state of operation. Thus, the circuit performs the "and" function.

An "or" gate is basically a buffer or a mixing circuit which permits a number of pulse sources to be connected to a common load. The circuit generally has two or more inputs and a single output. If a pulse is applied to any one or more of the inputs, a pulse appears at the output. The circuit of FIGURE 1 may be arranged to provide this type of operation by adjusting the amplitude of the energizing pulse 22 to a proper level so that any one information signal applied to the input terminals 24, 26 or 28 brings the tunnel diode over the peak 43 of the negative resistance characteristic, switching it to its other stable state of the operation. Thus the "or" function is provided.

A threshold gate is a circuit which has a plurality of inputs, to each of which is applied a pulse of common polarity. The circuit has a single output at which a pulse appears only if predetermined minimum number of pulses are applied to the input. Thus, in a threshold gate the amplitude of the energizing pulse 22 is adjusted so that no less than the predetermined minimum or threshold number of input pulses are required before the tunnel diode swtiches to an opposite state.

Figure 3:
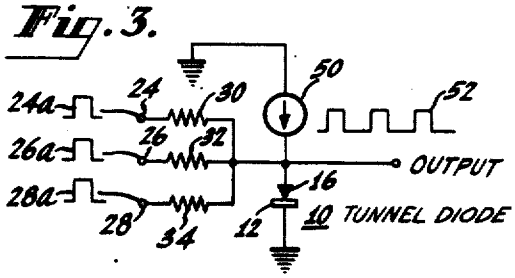

It has thus been shown that various logic functions can be performed by the switching circuits of FIGURES 1 and 3 by controlling the amplitude of the energizing voltage pulses applied to the tunnel diode. In practice, since a forward biased tunnel diode is a low impedance device, it is more convenient to energize the device from a constant current source rather than from the voltage source that is shown and described in FIGURE 1. A constant current pulse generating source may conveniently replace the pulse voltage generator 20 and the same type of bistable operation discussed heretofore may be obtained.

FIGURE 3 shows such a circuit in which a constant current pulse generator 50 replaces the pulse generator 20 of FIGURE 1. This circuit modification also permits elimination of the separate load resistor 18. The generator 50 is arranged to deliver a train of current pulses 52, identical in wave form to the voltage pulses 22.

Figure 4:
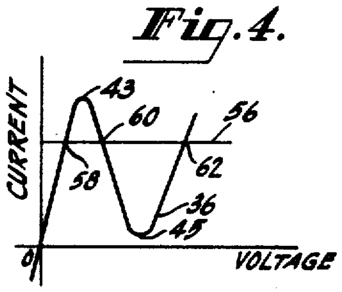

FIGURE 4 illustrates graphically the operating characteristic of this circuit. Since a constant current source is being utilized and the load resistor 18 is eliminated, a substantially horizontal load line 56 is obtained. This load line intersects the characteristic curve 36 in three points, namely points 58, 60 and 62. For the reasons discussed heretofore, the operating points 58 and 62 are points of stable operation while the operating point 60 is a point of unstable operation. Hence the circuit is bistable.

This circuit operates in a similar manner to the circuit of FIGURE 1. That is, the current supplied to the tunnel diode 10 by the pulse current generator 50 is adjusted in amplitude so that either a single information signal or a plurality of information signals are required to bring the operating point 58 of the tunnel diode to the peak 43 of the negative resistance characteristic 36, thus shifting the operating condition to the point 62. Thus, an "or" gate, an "and" gate or a threshold gate circuit may be provided by this one simple circuit without requiring any circuit alterations.

Figure 5:
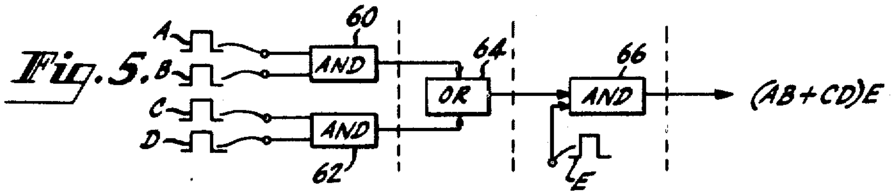
FIGURE 5 is a block diagram showing in general how switching circuits of the type shown in FIGURES 1 and 3 can be interconnected to perform a desired logic operation.

Circuits of the type described heretofore can be interconnected to form various logic systems. FIGURE 5 shows, for illustrative purposes only, one particular type of logic system which may be obtained using only tunnel diode "and" gates and "or" gates. The system shown has pulse type input signals A ,B, C, and D applied thereto and the logic function $(AB+CD)E$ is obtained at the output. The circuit comprises a first "and" gate 60 to which the input signals A and B are applied, and a second "and" gate 62 to which the input signals C and D are applied. Any output signals derived from these "and" gates are applied simultaneously as input signals to an "or" gate 64. The output signal from the "or" gate 64 and the additional input signal E are then applied to a third "and" gate 66, from the output of which the desired function $(AB+CD)E$ is obtained. The gates may be like those of FIGURE 1 or like those of FIGURE 3. Systems of this type may be useful in various digital data handling machines.

To obtain a system of this type utilizing the tunnel diode circuits described heretofore, requires a method of insuring that the information signals transfer in the desired direction through the system. That is, since the tunnel diode is a two terminal device, one terminal must act as both the input terminal and the output terminal. A means must therefore be provided for making the circuit directional so that the information signal propagates from input to output. One method of achieving this is to separate input and output functions in time by use of a sequential energizing system.

Figure 6:
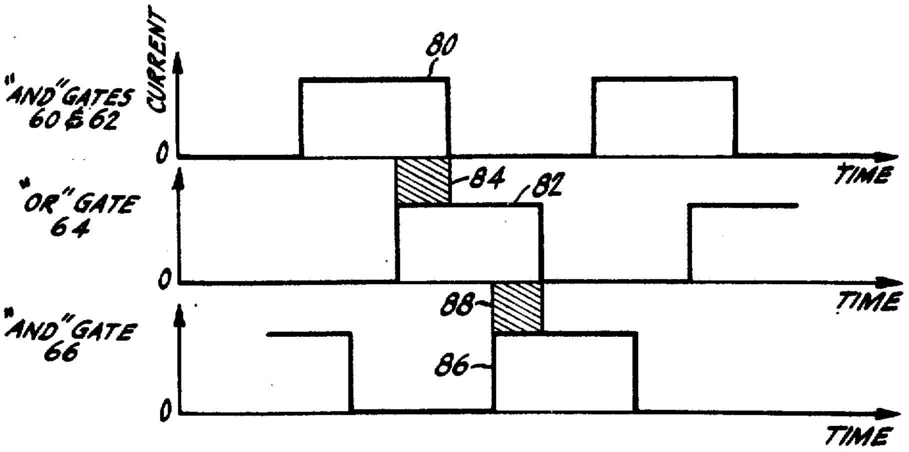
FIGURE 6 is a graph showing how energizing signals are applied to the switching circuits of the invention to provide information transfer between stages.

In FIGURE 6, the time or phase relationships of the constant current energizing pulses applied to the logic system of FIGURE 5 is shown. In operation, both the "and" gates 60 and 62 are energized by a current pulse such as is illustrated at 80 in FIGURE 6. Information signals denoted A, B, C, and D are applied in synchronism with the energizing current pulse 80, and just prior to the termination of the energizing pulse, the "or" gate 64 is energized by another current pulse 82.

The current pulses 80 and 82 are synchronized so that they overlap, for example, as illustrated in the period corresponding to the shaded area 84. This overlap of the energizing pulses in time is provided so that the operating states of the "and" gates 60 and 62 are effective to influence the state of the "or" gate 64 during the time period 84.

Put another way, the load line for "and" gates 60 and 62 is as shown at 56 in FIG. 4, for example. The diodes of "and" gates 60 and 62 assume operating point 58 (FIG. 4) in the low voltage state in response to energizing pulse 80. If pulses A and B are applied to gate 60 or C and D to gate 62, they are sufficient, when added to the energizing pulse, to switch the diode of gate 60 and/or 62 to its high voltage state (operating point 62 of FIG. 4). During the interval 84, energizing pulse 82 places the diode of "or" gate 64 at its operating point 58 (FIG. 4) in the low voltage state. If, during the interval 84, either or both "and" gates 60 and 62 are in their high voltage state, the high voltage present added to the energizing pulse 82 switches the diode of "or" gate 64 to its high voltage state. After the interval 84, the diodes of "and" gates 60 and 62 both return to zero volts, but the energizing pulse 82 is of sufficient amplitude to maintain the diode of "or" gate 64 in its high voltage state.

In a similar manner, the "and" gate 66 is now energized by a current pulse 86, and the information signal E is simultaneously applied to this stage. The energizing current pulse 86 is arranged to overlap the energizing current pulse 82 applied to the "or" gate 64 in the time period indicated by the shaded area 88. Thus, the condition of the "or" gate stage 64 may now influence the condition of the "and" gate 66. In other words, in a cascaded system of logical gates, the energizing pulses are timed so that just after one of the gates has switched state and while it is still energized, a succeeding gate is energized, whereby the one stage is effective to supply an input signal to the succeeding stage. Thereafter, energization is removed from the one stage. The succeeding stage is then in a position to supply an input signal to a following stage, but cannot reverse the procedure and supply an input signal back to the preceding one stage, since at this time the one stage is no longer energized. Thus, the input function for a stage is achieved during the beginning of the application of its current energizing pulse and the output function is achieved at the termination of the current energizing pulse. In this manner, the proper signal flow direction is achieved.

There have thus been shown and described novel logical gating circuits each gate of which employs a single two terminal negative resistance semiconductor diode. By simply controlling the amplitude of the energizing pulses applied to the diode, either an "and" gate, an "or" gate or a threshold gate is conveniently obtained. In systems utilizing cascaded stages of this type, unilateral signal flow is obtained by sequentially energizing successive stages and by providing prodetermined duration of overlap between the energizing pulses.

What is claimed is:

1. A switching circuit comprising a semiconductor device having only two terminals and a negative resistance characteristic, said switching circuit having two stable states of operation, means connected to said terminals for applying an energizing signal of selected amplitude thereto, whereby said circuit assumes one of its two stable operating states, and means for switching said circuit to the other one of its stable operating states, said means including means for applying a plurality of information signals to said terminals during the application of said energizing signal.

2. A switching circuit comprising a negative resistance diode of the voltage controlled type having two stable operating states, one in a lower and the other in a higher voltage range, means for concurrently applying pulse type energizing signals of selected amplitude and a plurality of pulse type information signals to said diode, the amplitude of said energizing signals being selected so that only one information signal is required to switch said diode from one of its stable operating states to the other of its stable operating states.

3. A switching circuit comprising a negative resistance diode having two stable operating regions at a given value of input current, one at a higher and the other in a lower voltage range, means for concurrently applying pulse type energizing signals of selected amplitude and a plurality of pulse type information signals to said diode, the amplitude of said energizing signals being selected so that a plurality of information signals are required to switch said semiconductor diode from one of its stable operating states to the other of its stable operating states.

4. A switching system comprising a series of interconnected switching stages, each said switching stages each including solely one negative resistance semiconductor diode, each of said diodes having two stable operating states to represent the two binary digits, first terminal means at each diode for sequentially applying input signals to said diodes, second terminal means at each diode for sequentially applying energizing signals to said diodes in synchronism with said input signals, and means for timing said energizing signals so that they overlap for a period of time in successive stages whereby signal propagation occurs in only one direction between successive stages.

5. A switching circuit comprising, in combination, a negative resistance semiconductor diode having two stable operating states, both in the positive resistance operating region; means for applying energizing pulses to said diode in a direction to forward bias the diode, whereby said diode intermittently assumes one of its stable operating states; and means for applying information pulses to said diode at an amplitude such that the concurrent application of an information pulse and an energizing pulse switches said diode to its other stable operating state.

6. A switching circuit comprising, a negative resistance diode which is capable of assuming one of two discrete voltage values across the diode in response to a given input current, one of said values lying in one stable operating state of the diode and the other lying in another stable operating state of the diode; means for applying substantially constant current energizing pulses of one amplitude to said diode for placing the diode in one of its stable operating states during the application of said pulses; and means for applying substantially constant current input pulses to said diode concurrently with each energizing pulse and at an amplitude such that at least a given number of said input pulses applied concurrently are required to switch said diode from said one stable operating state to another stable operating state.

7. In combination, a negative resistance diode having two stable operating states, each in a positive resistance operating region, and each at a substantial different value of voltage; means for applying a forward operating current to the diode, whereby the diode assumes one of said stable states; and means for applying concurrent pulses of the same polarity to the diode during the period said operating current is applied for switching the diode to its other stable state.

8. In the combination as set forth in claim 5, said means for applying a forward operating current comprising means for applying a current pulse.

9. In combination, a negative resistance diode of the voltage controlled type having two positive resistance operating regions, each in a different voltage range: and means for applying concurrent pulses to the diode in a polarity and amplitude to switch the diode from one of its positive resistance operating regions to the other.

10. In combination, a tunnel diode having two stable operating states, one in a low voltage range which includes zero, and the other in a higher voltage range, said diode quiescently operating in its one stable state; and means for switching said diode to its other stable state comprising means for applying thereto concurrent forward bias pulses.

11. In combination, a plurality of cascade connected, pulse responsive, logic circuits, each normally capable of propagating an output signal in either the forward or backward direction, and each capable of assuming one of two stable operating states; means for sequentially applying energizing pulses to said circuits in such manner that each circuit is enabled after the immediately preceding circuit is enabled and before the immediately succeeding circuit is enabled, and is disabled after the immediately succeeding circuit is enabled; and means for applying signals indicative of binary digits to each stage during the application of energizing pulses to that stage.

12. In combination, a plurality of tunnel diodes connected in cascade; and means for sequentially applying energizing pulses to succeeding diodes timed to enable each diode after its immediately preceding diode is enabled, and to disable each diode after its immediately succeeding diode is enabled and before said immediately succeeding diode enables the following diode.

13. In a system of logic, a plurality of cascade connected, tunnel diode gates; means for sequentially applying pulses to said diode gates timed to enable each diode gate after its immediately preceding diode gate is enabled, and to disable each diode gate after its immediately succeeding diode gate is enabled and before said immediately succeeding diode gate enables the following diode gate; and means for applying information pulses to each diode gate concurrently with the application of energizing pulses to that diode gate.

References Cited in the file of this patent

UNITED STATES PATENTS

| | | |
|---|---|---|
| 1,883,613 | Devol | Oct. 18, 1932 |
| 2,614,142 | Edson | Oct. 14, 1952 |
| 2,647,995 | Dickinson | Aug. 4, 1953 |
| 2,730,632 | Curtis | Jan. 10, 1956 |
| 2,762,936 | Forrest | Sept. 11, 1956 |
| 2,855,524 | Shockley | Oct. 7, 1958 |
| 2,863,070 | Suran | Dec. 2, 1958 |
| 2,869,000 | Bruce | Jan. 13, 1959 |
| 2,912,598 | Shockley | Nov. 10, 1959 |
| 2,944,164 | Odell | July 5, 1960 |

FOREIGN PATENTS

| | | |
|---|---|---|
| 159,041 | Australia | Sept. 27, 1954 |
| 494,864 | Canada | July 28, 1953 |

OTHER REFERENCES

Electronics February 1946, page 120, FIGURE 6.

Esaki: "New Phenomenon . . ." Physical Review, vol. 109 (1958), page 603–4.

UNITED STATES PATENT OFFICE
CERTIFICATE OF CORRECTION

Patent No. 3,078,376 February 19, 1963

Morton Herbert Lewin

It is hereby certified that error appears in the above numbered patent requiring correction and that the said Letters Patent should read as corrected below.

Column 6, line 54, for "substantial" read -- substantially --; column 7, line 24, before "pulses" insert -- energizing --.

Signed and sealed this 24th day of September 1963.

(SEAL)
Attest:

ERNEST W. SWIDER
Attesting Officer

DAVID L. LADD
Commissioner of Patents